United States Patent
Lakshmikumar et al.

(10) Patent No.: US 8,344,761 B2
(45) Date of Patent: Jan. 1, 2013

(54) 3-LEVEL LINE DRIVER

(75) Inventors: Kadaba Lakshmikumar, Basking Ridge, NJ (US); Sander Laurentius Johannes Gierkink, Hengelo (NL)

(73) Assignee: Ikanos Communications, Inc., Fremont, CA (US)

( * ) Notice: Subject to any disclaimer, the term of this patent is extended or adjusted under 35 U.S.C. 154(b) by 167 days.

(21) Appl. No.: 12/557,584

(22) Filed: Sep. 11, 2009

(65) Prior Publication Data

US 2010/0073063 A1 Mar. 25, 2010

Related U.S. Application Data

(60) Provisional application No. 61/098,584, filed on Sep. 19, 2008.

(51) Int. Cl.
*H03B 1/00* (2006.01)
(52) U.S. Cl. ........ 327/108; 327/112; 327/379; 327/391; 326/21; 326/30; 326/82
(58) Field of Classification Search .......... 327/108–112, 327/379, 389, 391; 326/21–24, 26–27, 30, 326/82–83, 87
See application file for complete search history.

(56) References Cited

U.S. PATENT DOCUMENTS

| | | | | |
|---|---|---|---|---|
| 6,164,297 | A | * | 12/2000 | Kamikawa ...................... 134/61 |
| 7,657,564 | B2 | * | 2/2010 | Hsu et al. ........................ 333/186 |
| 2007/0024365 | A1 | * | 2/2007 | Ramaswamy et al. ........ 330/251 |

OTHER PUBLICATIONS

Toru Ido, et al., "A Digital Input Controller for Audio Class-D Amplifiers with 100W 0.004% THD+N and 113dB DR", ISSCC 2006 / Session 19 / Analog Techniques / 19.3, Feb. 7, 2006, 2006 IEEE International Solid-State Circuits Conference, 1-4244-0079-1/06 © 2006 IEEE.

Serneels, et al., "A 237mW aDSL2+ CO Line Driver in Standard 1.2V 0.13 µm CMOS", ISSCC 2007 / Session 29 / Analog and Power Management Techniques / 29.4, Feb. 14, 2007, 2007 IEEE International Solid-State Circuits Conference, 1-4244-0852-0/07/$25.00 © 2007 IEEE.

Risbo, et al., "PWM Amplifier Control Loops with Minimum Aliasing Distortion", Convention Paper 6693, Audio Engineering Society 120th Convention, Paris, France, May 20-23, 2006, pp. 1-15.

Piessens, et al., "Highly Efficient xDSL Line Drivers in 0.35-µm CMOS Using a Self-Oscillating Power Amplifier", IEEE Journal of Solid-State Circuits, vol. 38, No. 1, Jan. 2003, pp. 22-29, 0018-9200/03$17.00 © 2003 IEEE.

* cited by examiner

*Primary Examiner* — Lincoln Donovan
*Assistant Examiner* — Shikha Goyal
(74) *Attorney, Agent, or Firm* — Mark J. Danielson; Pillsbury Winthrop Shaw Pittman LLP

(57) ABSTRACT

Included are embodiments of a 3-level line driver. At least one embodiment of a method includes generating a repetitive wave; receiving an input signal and a complement of the input signal; providing a 3-level output signal; and filtering a feedback signal, the means for filtering including at least one of the following: a $0^{th}$ order filter, and an even order filter.

23 Claims, 12 Drawing Sheets

2-level PWM line driver – a square current is applied to the integrator, comparators have zero reference

3-LEVEL LINE DRIVER

CROSS REFERENCE

This application claims the benefit of U.S. Provisional Application No. 61/098,584, filed Sep. 19, 2008, which is incorporated by reference in its entirety. Also incorporated by reference in its entirety is "A 3-Level PWM ADSL2+ CO Line Driver" written by Sander Gierkink, Kadaba Lakshmikumar, Vinod Mukundagiri, Drahoslav Lim, Arnold Muralt, and Fred Larsen.

BACKGROUND

A sampling scheme to generate pulse width modulated (PWM) signals may include a comparator to compare an input signal with a triangular waveform. The design of such a comparator in a fully differential manner can be difficult. First, a fully differential comparator may utilize two input terminals and two reference inputs for the differential reference. The input stage may be arranged as a differential differencing amplifier. Further, an input common mode of the circuit may be from rail-to-rail. These constraints can adversely affect the speed and accuracy of the comparator.

Further, a digital subscriber line (DSL) line driver at a central office (CO) may be implemented as a bipolar class-AB amplifier. However, linear amplification of a discrete multi tone (DMT) signal may be very power inefficient because the signal hovers around zero with occasional peaks due to the large peak-to-root mean square (rms) ratio (PAR).

SUMMARY

Included are embodiments of a 3-level line driver. At least one exemplary embodiment includes means for generating a repetitive wave, means for receiving an input signal and a complement of the input signal, means for providing a 3-level output signal, and means for filtering a feedback signal, the means for filtering including at least one of the following: a $0^{th}$ order filter and an second order filter.

Also included are embodiments of a method. At least one embodiment of a method includes generating a repetitive wave; receiving an input signal and a complement of the input signal; providing a 3-level output signal; and filtering a feedback signal, the means for filtering including at least one of the following: a $0^{th}$ order filter and a second order filter.

Other embodiments and/or advantages of this disclosure will be or may become apparent to one with skill in the art upon examination of the following drawings and detailed description. It is intended that all such additional systems, methods, features, and advantages be included within this description and be within the scope of the present disclosure.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

DETAILED DESCRIPTION

To deliver 20 dBm of power in an asynchronous digital subscriber line 2+ (ADSL2+) system, the peak line voltage is generally about 18 Volts. As technology limits supply voltage, a step-up transformer is often used. For a given technology, it can be shown that class-D power amplifier efficiency degrades as transformer ratio is increased and/or supply voltage is reduced. Further, step-up ratios larger than 2.5 may become impractical, as such ratios can degrade transformer bandwidth and signal to noise ratio (SNR) of the signal received from a customer premise equipment (CPE). Therefore, it is desirable to choose a process that supports high voltage. Although some complementary metal oxide semiconductor (CMOS) processes offer high-voltage double diffused metal oxide semiconductor (DMOS) transistors, DMOS devices are generally much slower than the CMOS devices. Further, such processes are often more expensive than conventional CMOS. Embodiments disclosed herein may use a mainstream 0.35 µm CMOS technology with thick oxide 5V transistors that can support a 10V supply voltage when stacked. Core devices may be used to perform low-power signal processing. Three-level (+1, 0, −1) differential pulse width modulation (PWM) is chosen to better track the predominantly low-level DMT signal. The switching frequency of each bridge half is approximately only 8.832 MHz compared to the 25 MHz self-oscillation frequency of an earlier solution. The lower switching rate is favorable for lower power consumption. Class-D PWM amplifiers are common in audio applications. The triangle or ramp rate for audio is generally more than a factor of ten times the signal bandwidth. For broadband applications, such large over-sampling may be difficult to utilize.

Figure 1:
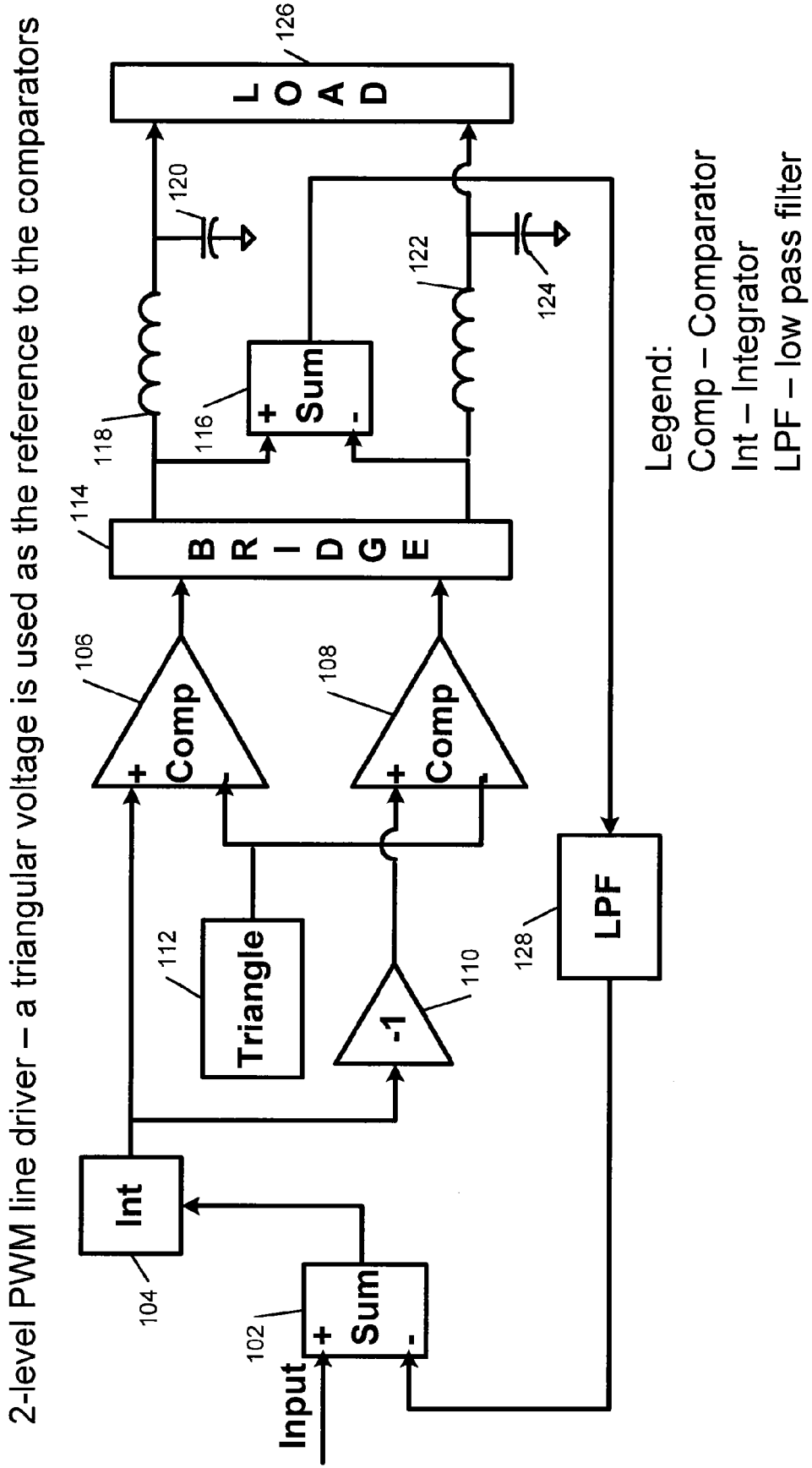
FIG. 1 illustrates an exemplary 2-level PWM line driver with a triangular voltage being used as a reference.

Referring now to the drawings, FIG. 1 illustrates an exemplary 2-level PWM line driver with a triangular voltage being used as a reference. As illustrated in the nonlimiting example of FIG. 1, an input signal is received at a summer 102, which subtracts the input signal with a feedback signal. The subtracted signal is sent to an integrator 104, which may be configured to output a signal that is an integrated version of the input. The integrator sends the integrated signal to a comparator 106, as well as to a comparator 108 via inverter 110. The comparators 106 and 108 compare the received signals with a triangle wave from triangle generator 112 to obtain naturally sampled PWM signals, which drive a bridge or other bridge power stage 114. The comparators 106 and 108 send the resulting compared signals to the bridge 114. The bridge 114 processes and sends the signals to a summer 116 for subtraction, as well to inductors 118, 122 and capacitors 120, 124 for filtering out high frequency portions of the signal. The resulting signals are sent to a load 126.

Additionally, the summer 116 subtracts the received signals and sends the subtracted signal to a low pass filter (LPF) 128. The LPF 128 further suppresses high frequency Bessel components that are sent to the summer 102 and comparators 106, 108. This reduces the aliasing effect caused by the feedback signal.

Figure 2:
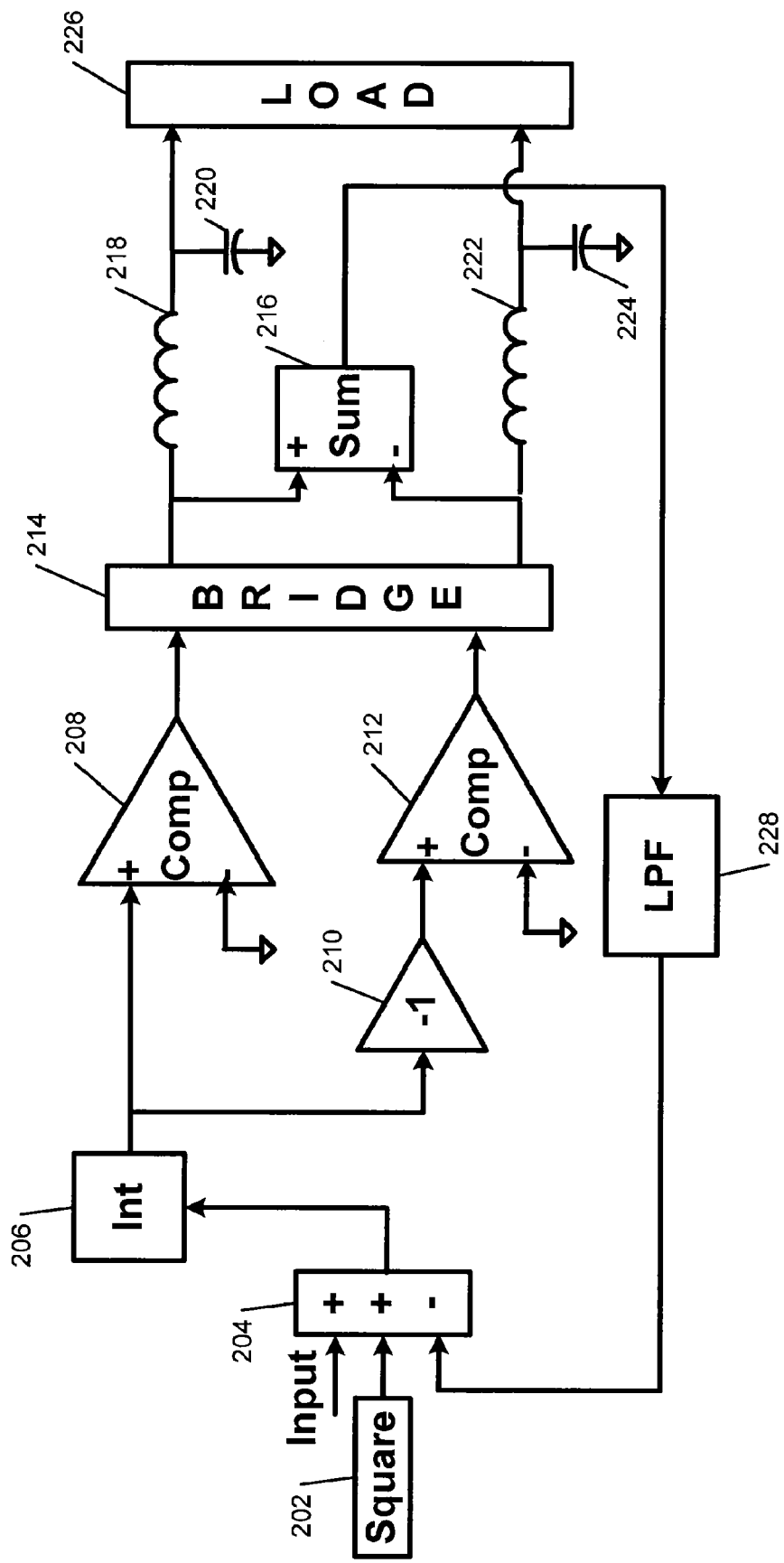
FIG. 2 illustrates an exemplary 2-level PWM line driver with a square current being applied to the integrator, similar to the diagram from FIG. 1.

FIG. 2 illustrates an exemplary 2-level PWM line driver with a square current being applied to the integrator, similar to the diagram from FIG. 1. As illustrated in FIG. 2, a square wave generator 202 is configured to generate a square wave for input into a combiner 204. Also received at the combiner 204 are an input signal and a feedback signal from an LPF 228. The combiner 204 may be configured to add the square wave with the input signal and subtract the feedback signal. The resulting signal may be sent to an integrator 206. As with FIG. 1, the integrator may be configured to integrate the received signal. Additionally, the integrator 206 can convert the square wave into a triangular voltage.

The integrator 206 may send the integrated signal to a first comparator 208, which is also referenced to ground. Similarly, the integrated signal may also be sent to an inverter 210, which inverts the signal and sends the inverted signal to a comparator 212. One should note that, in some embodiments, all the circuit blocks are fully differential although shown as single-ended to simplify the drawings. Hence, the integrator may be configured to provide both true and complementary (inverted) outputs. Block 210 is only a mathematical representation of the inverted signal. The comparator 212 compares the inverted signal with ground and sends the resulting signal to the bridge 214. The bridge 214 processes the received signals and sends the processed signals to a summer 216, as well as to inductors 218, 222 and capacitors 220 and 224. The inductor/capacitor pairs may be configured to filter high frequency portions of the signal before being sent to the load 226.

Additionally, as indicated above, the summer 216 receives the processed signals from the bridge 214 and subtracts them. The summer 216 additionally sends the resulting signal as a feedback signal to the LPF 228 and back to the combiner 204.

Figure 3:
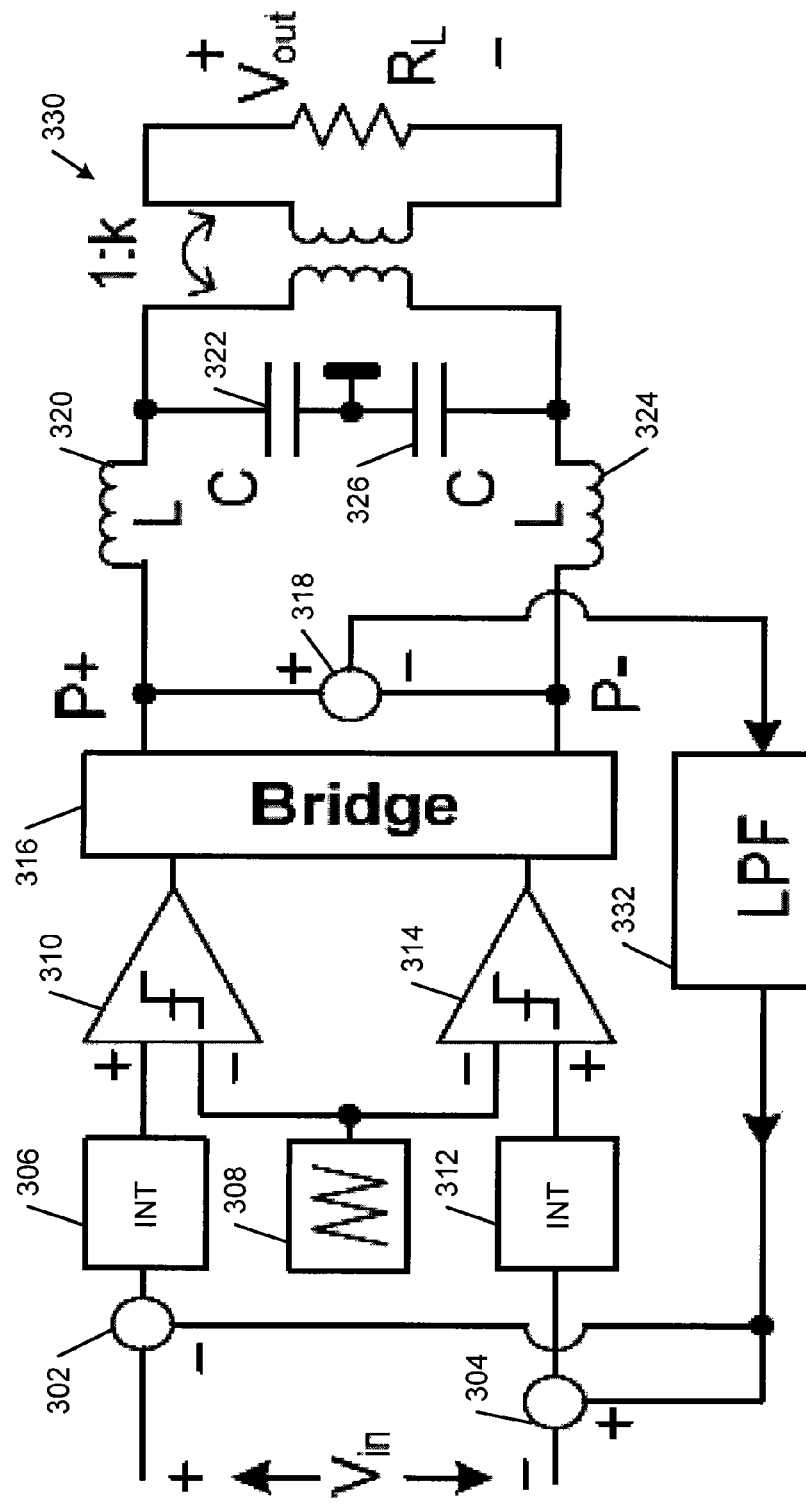
FIG. 3 illustrates an exemplary embodiment of a 3-level PWM line driver, with triangular reference to comparators, similar to the 2-level line driver from FIG. 1.

FIG. 3 illustrates an exemplary embodiment of a 3-level line driver, similar to the 2-level line driver from FIG. 1. As illustrated in other embodiments, true and complementary versions of an analog input signal from integrators 306 and 312 are compared with a triangular waveform from triangle wave generator 308 to obtain naturally sampled PWM signals. The naturally sampled PWM signals may be configured to drive the bridge power stage 316. Additionally, a differencing operation in the bridge results in a 3-level PWM signal. The signals P+ and P− may be combined by combiner 318 to result in a feedback signal. The feedback may be configured to minimize non-linearity introduced in the power stage. An LPF 332 may be configured to reduce aliasing by suppressing the high-frequency Bessel components that feed back into the comparators 310 and 314, via the integrators 306 and 312 (after being combined with input signals via combiners 302 and 304). The integrators 306 and 312 in the forward path provide the in-band distortion "shaping". The LC (inductor 320 and capacitor 322; inductor 324 and capacitor 326) filters and suppresses high frequency energy and increases the load impedance seen by the power stage at the switching frequency. The filtered signal may be sent to a transformer 330 to provide an output voltage $V_{out}$.

The frequency of the triangular signal ($f_{triangle}$) from the triangle wave generator 308 may be configured to be minimal to reduce switching losses and dissipation in the low level signal processing section. However, a low switching frequency may lead to an increase in distortion due to aliasing. Aliasing can occur when high-frequency Bessel components located around multiples of $f_{triangle}$ feed back into the comparators that perform natural sampling. Thus, energy folds into the signal band and results in distortion, even in an ideal system. Aliasing may depend strongly on a transfer function from comparator output back to its input, similar to a 2-level PWM. As this transfer also affects the distortion "shaping," the overall goal is to find a loop transfer that minimizes aliasing while maximizing shaping.

Figure 4:
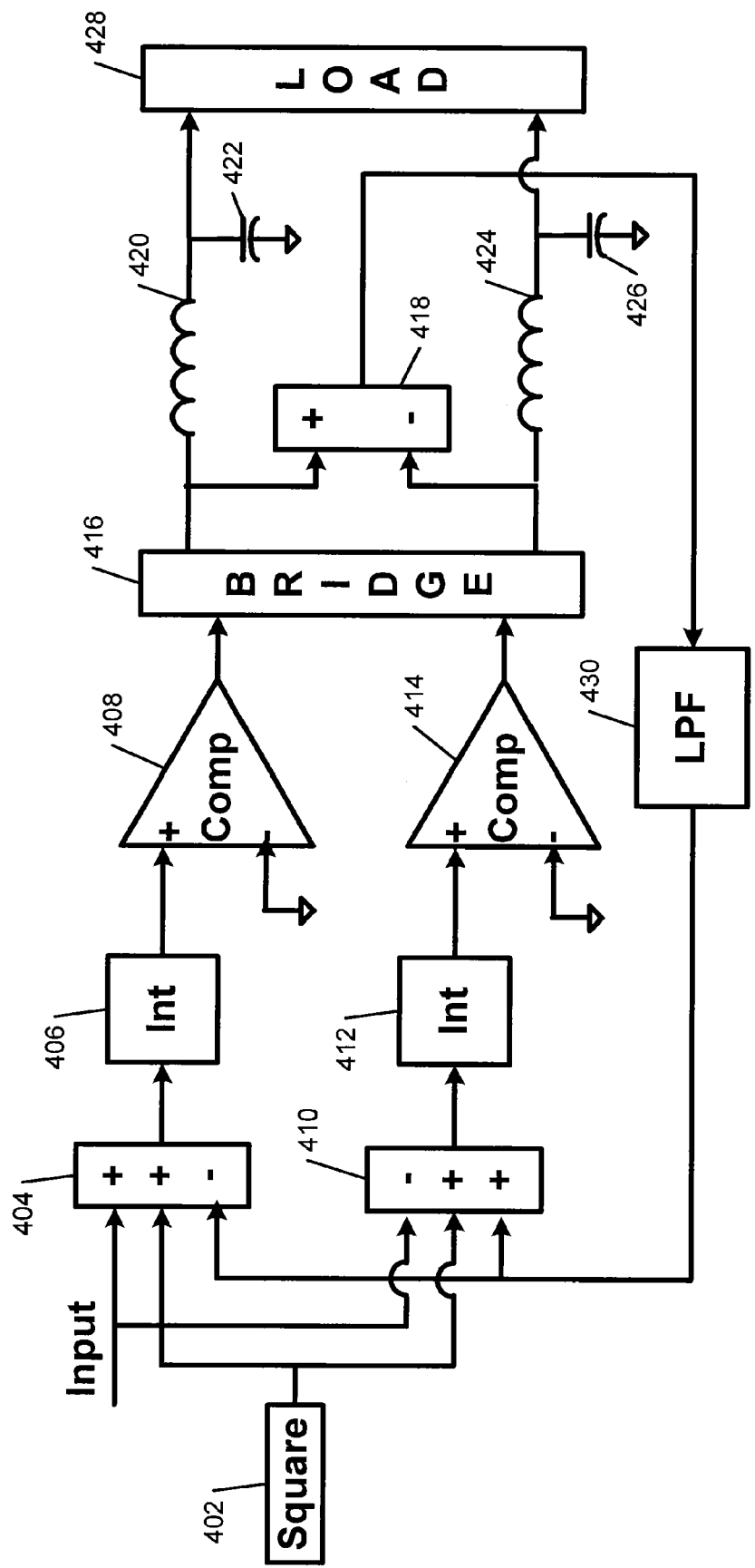
FIG. 4 illustrates an exemplary 3-level PWM line driver, with a square input current to the integrators, similar to the diagram from FIG. 2.

FIG. 4 illustrates an exemplary 3-level PWM line driver, with comparators referenced to ground, similar to the diagram from FIG. 2. As illustrated in the nonlimiting example of FIG. 3, a square wave generator 402 may be utilized as providing an input to combiners 404 and 410. The combiner 404 also receives an input signal and an inverted feedback signal from a LPF 430. Similarly, the combiner 410 receives the square wave signal, as well as the feedback signal from the LPF 430 and an inverted input signal. The combined signals are sent to integrators 406 and 412, respectively. As discussed above, the integrators integrate the input signal.

After integration, the signals from integrators 406 and 412 may be sent to comparators 408 and 414, respectively. The comparators 408 and 414 compare the received signals to ground and send the result to a bridge 416. The bridge 416 processes the received signals, and sends the processed signals to a combiner 418, as well as inductors 420, 424, and capacitors 422, 426. From the inductor/capacitor pairs (which serve to filter out high frequency portions of the signals), the signals are sent to a load 428. Additionally, the combiner 418 subtracts the signals received from the bridge 416 and sends the subtracted signal as a feedback signal to the LPF 430, which is returned to combiners 404 and 410, as discussed above. One issue with this scheme is that the integrators may be sensitive to offset errors. Offset can saturate the output of the integrators 406 and 412.

Figure 5:
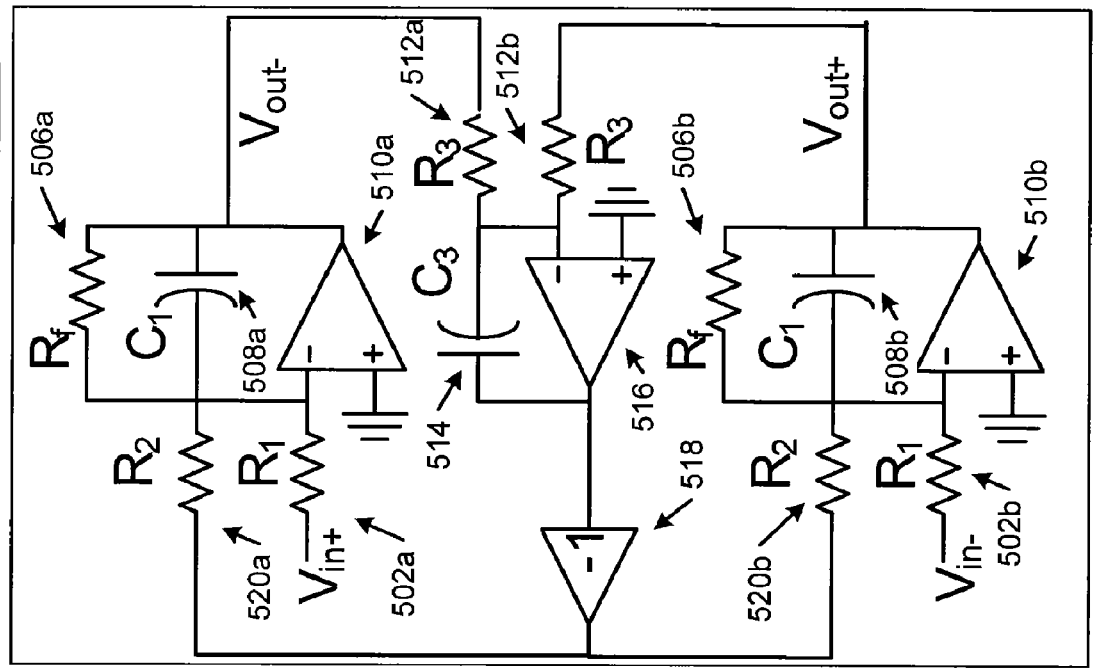
FIG. 5 illustrates an exemplary embodiment of integrators with a common mode direct current (DC) feedback, such as might be utilized in FIG. 4.

FIG. 5 illustrates an exemplary embodiment of integrators with common-mode direct current (DC) feedback, such as might be utilized in FIG. 4. As illustrated in the nonlimiting example of FIG. 5, the input voltage ($V_{in}+$ and $V_{in}-$) may be the same input received at integrators 306 and/or 312 from FIG. 3. The voltage may be sent to a resistor $R_1$ 502a and $R_1$ 502b. From the resistors $R_1$ 502a, 502b, the signal may be sent to a negative terminal of op amps 510a and 510b, which have a positive terminal coupled to ground. From $R_1$ 502a, 502b, the signal may also be sent to a capacitors $C_1$ 508a and 508b, and resistors $R_f$ 506a and 506b. The signal ($V_{out}+$ and $V_{out}-$) may then be sent to a resistors $R_3$ 512a and 512b, respectively and then combined and sent to a negative terminal of an operational amplifier (op amp) 516 (with a positive terminal coupled to ground), as well as a capacitor $C_3$ 514. The signal may be recombined and sent to an inverter 518, which may be sent back to resistors $R_2$ 504a and 504b as a direct current feedback signal. Such a configuration may be utilized to overcome offset problems associated with integrator saturation, described above.

Figure 6:
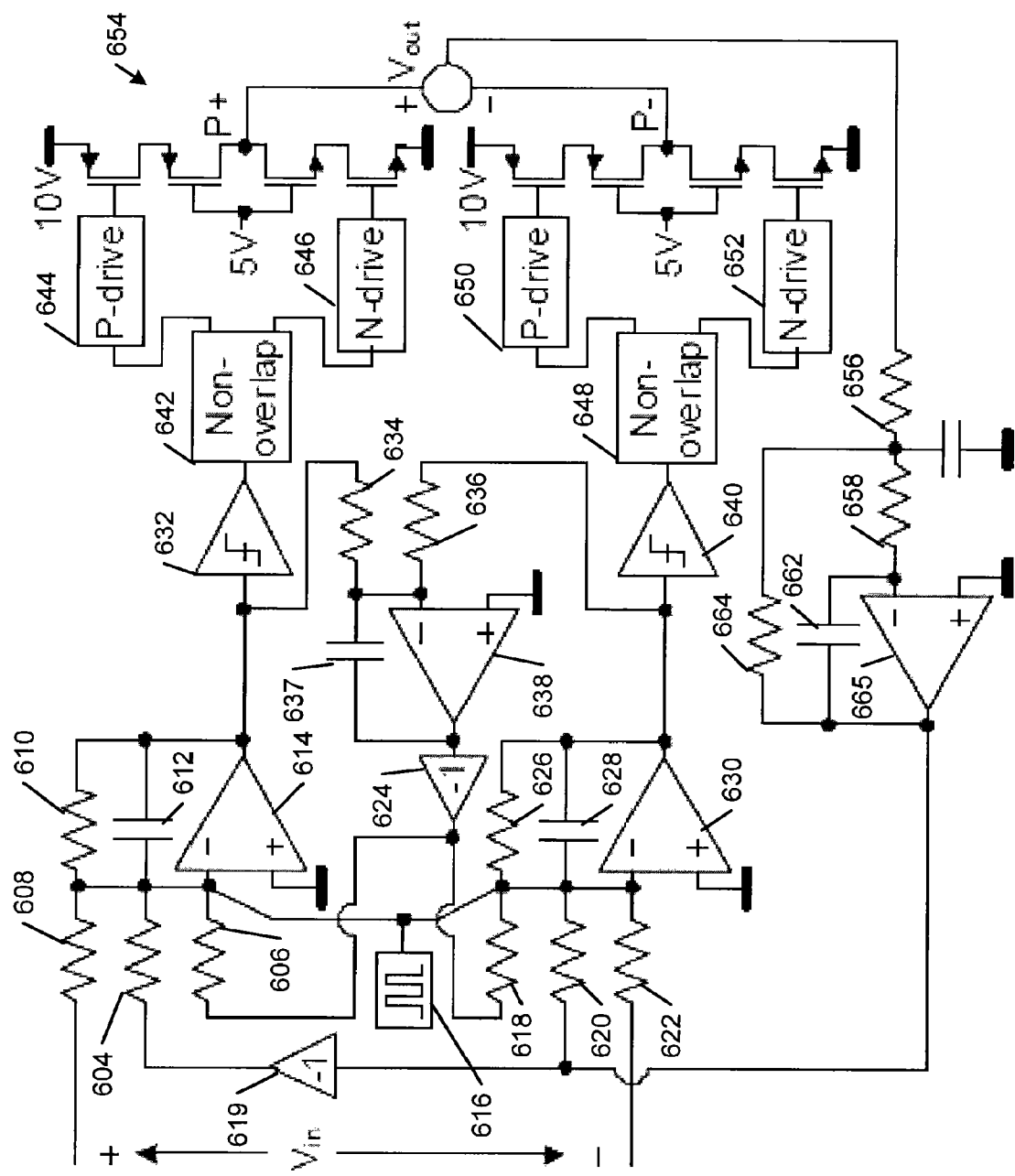
FIG. 6 illustrates another exemplary embodiment of a line driver, with common mode DC feedback, as illustrated in FIG. 5.

FIG. 6 illustrates another exemplary embodiment of a line driver, with common mode DC feedback, as illustrated in FIG. 5. The design in FIG. 6 is fully differential and illustrated as single ended for simplicity. A charge-pump 616 supplies a square current to the integrator (embodied as resistors 604, 606, 610, capacitor 612, inverter 619, and op amp 614 for a first integrator; and resistors 618, 620, 622, and 626, capacitor 628, and op amp 630), which generate the triangle.

Each forward integrator (e.g., resistors 634, 636, capacitor 637, op amp 638, and inverter 624) with the common DC feedback path forms a leaky integrator, e.g., an integrator with finite low-frequency gain. The leaky integrators' outputs may be configured to substantially match the response of an ideal integrator for frequencies above 100 kHz. The 2nd-order LPF in the feedback path (e.g., resistors 656, 658, 664, capacitor 662, and op amp 665) may be implemented as a Rauch biquad based on a single op-amp 665. This offers common mode suppression and performs a level shift from the 10V bridge section to the 3.3V signal processing part. A high supply voltage may be utilized to achieve high efficiency. A simple stack of two 5V transistors for both n- and p-devices may be configured for a supply voltage of 10V for the bridge. The gates of the cascode devices may be fixed at 5V. As the devices do not experience maximum gate-to-source and drain-to-source voltages at the same instant, hot carrier effects may be less. In a conventional CMOS process with a p-substrate, the p-channel devices can be placed in separate n-wells. As a result, the 10V supply appears across two drain-to-body diodes and junction breakdown is not an issue. Unfortunately, the n-channel devices have no isolated wells and the entire 10V appears across a single drain-to-substrate diode of the cascode device. The breakdown voltage of this process is just above 10V.

Figure 7A:
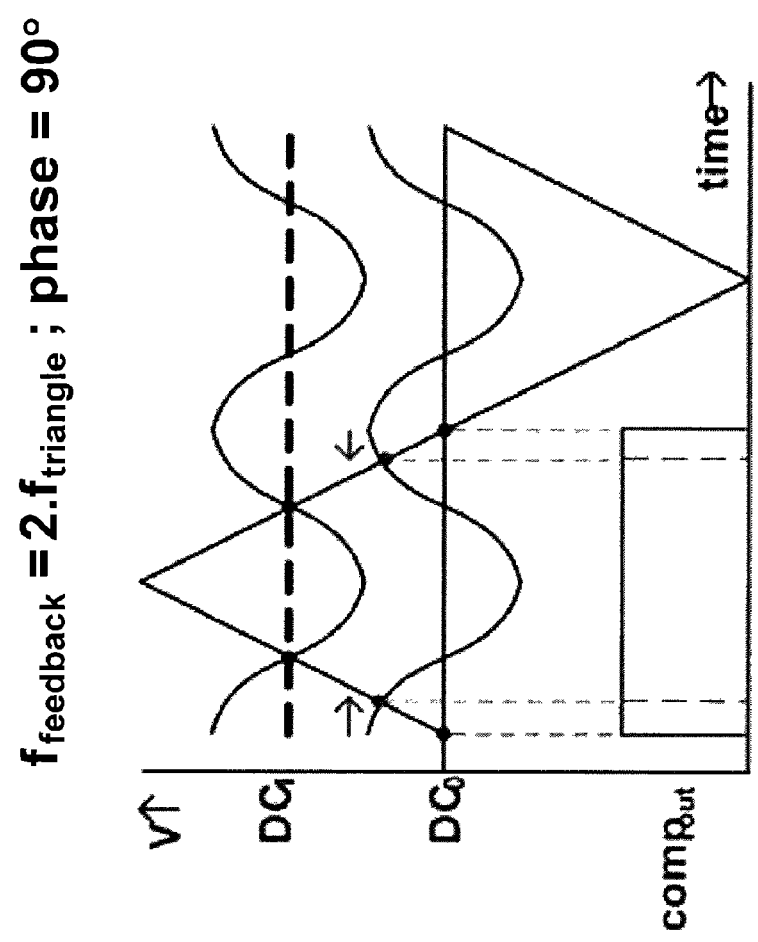
FIGS. 7A and 7B show the effect of the phase of the feedback signal, such as might be utilized in the line driver of FIGS. 3, 4, and/or 6.
Figure 7B:
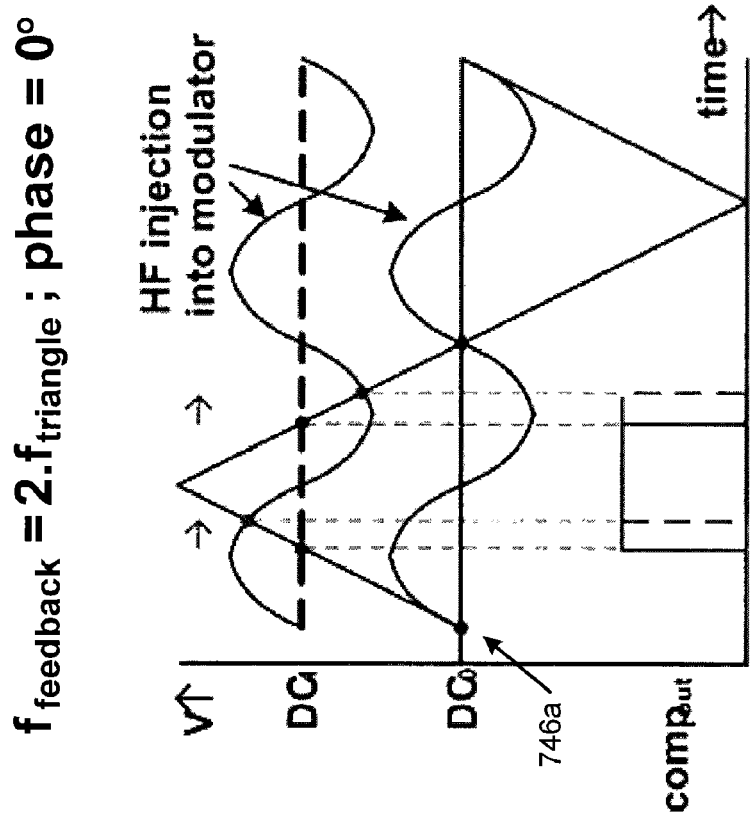

FIGS. 7A and 7B show the effect of the phase of the feedback signal, such as might be utilized in the line driver of FIG. 6. When the phase of the received signal is 0 compared to the triangle as shown in FIG. 7A for an input equal to $DC_1$, the $comp_{out}$ signal is displaced to the right and the width is not affected much. On the other hand, if the phase of the feedback signal is 90 as shown in FIG. 7B, the width of the $comp_{out}$ signal can shrink, thus introducing distortion.

Figure 8:
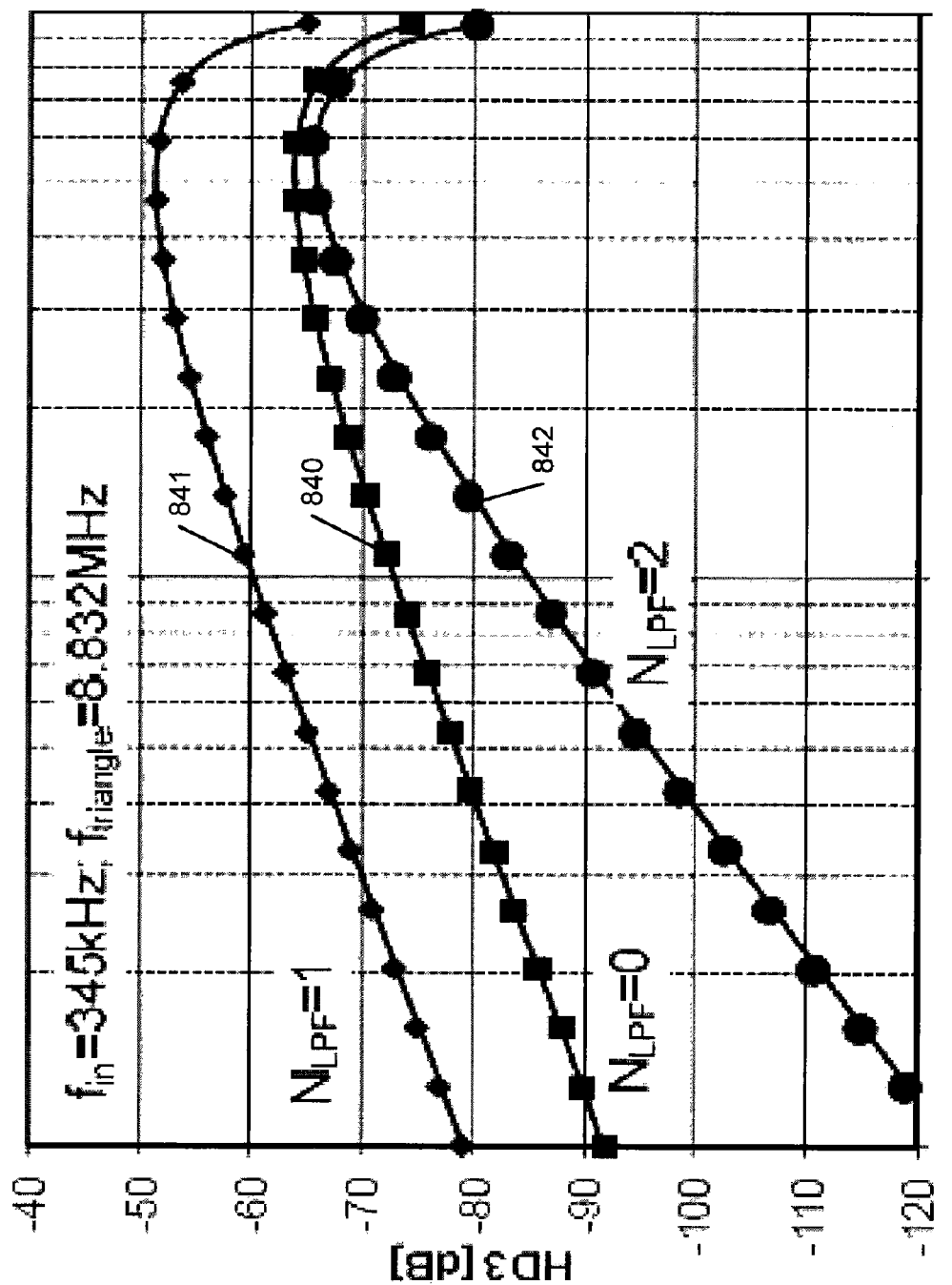
FIG. 8 illustrates exemplary theoretical and simulated third-order harmonic distortion (HD3) due to aliasing for a 3-level PWM closed loop system.

FIG. 8 illustrates exemplary theoretical and simulated third-order harmonic distortion (HD3) due to aliasing for a 3-level PWM closed loop system. This nonlimiting example assumes a single integrator with various feedback low-pass filter orders $N_{LPF}$; all components are ideal. Theoretical results are obtained by extending the theory of a 2-level PWM to a 3-level PWM and confirmed with simulation. Integrator $f_{triangle}$ and LPF cutoff frequencies are chosen such that the signal bandwidth is approximately 2.2 MHz.

As shown in FIG. 8, theory and simulation match closely. At very low and very high input amplitudes, distortion due to aliasing (HD3) may be less due to the decrease in energy of the high frequency Bessel components in the 3-level PWM signal. Surprisingly, a single integrator without any LPF ($N_{LPF}=0$; plot 840) outperforms a combination of integrator and $1^{st}$-order feedback filter (plot 841). Even though the $1^{st}$-order filter reduces high frequency Bessel components, it worsens aliasing. This is because both magnitude and phase transfer from modulator output back to its input play a crucial role in the amount of aliasing. The $2^{nd}$-order filter (plot 842) provides a better solution, particularly at medium and low input levels. As the DMT signal hovers around zero most of the time, the system benefits from having a $2^{nd}$-order filter in the feedback path. Similarly, other even order filters ($2^{nd}$-order, $4^{th}$-order, etc.) and/or $0^{th}$-order filters may have similar results.

Figure 9:
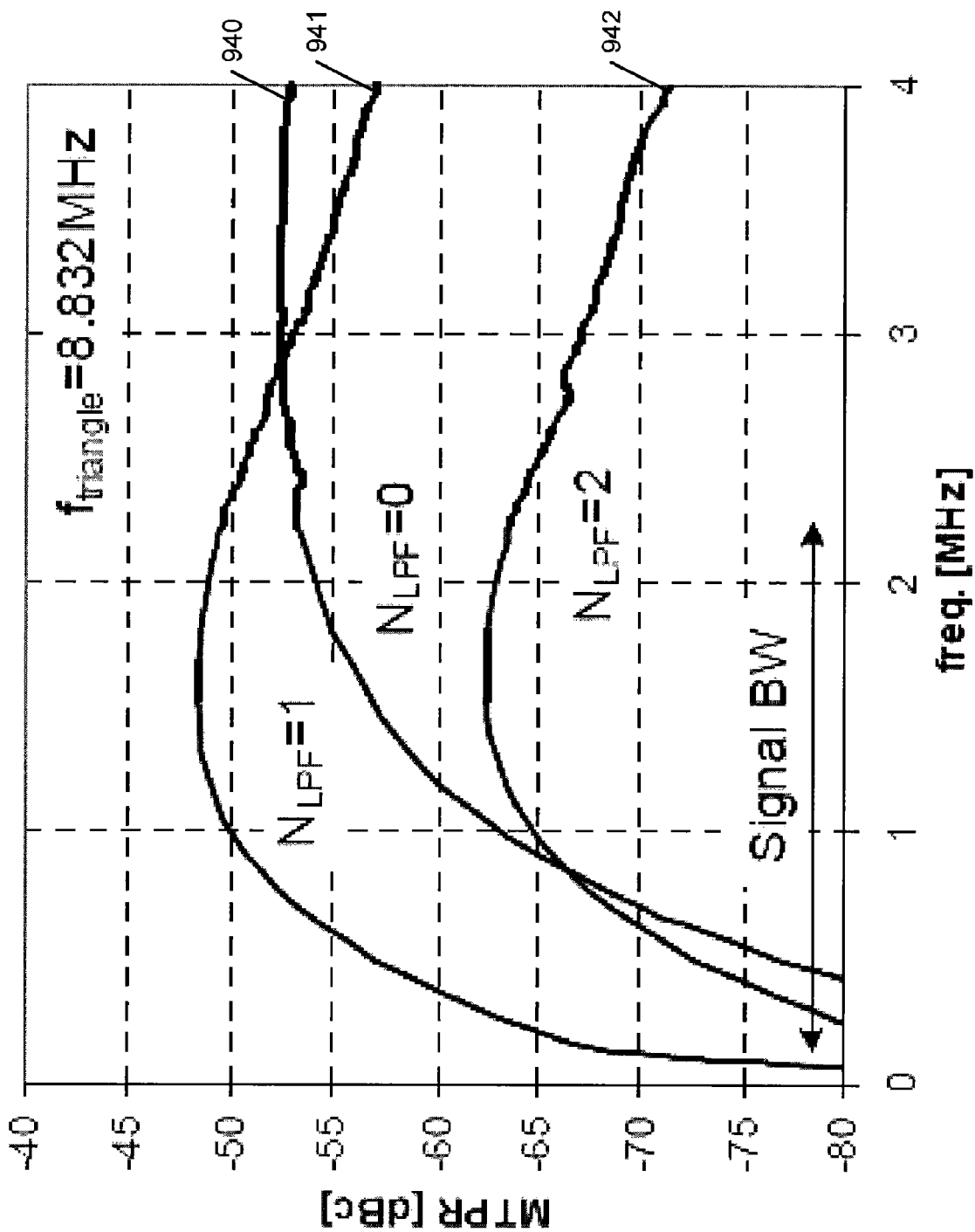
FIG. 9 illustrates an exemplary simulated multi-tone-power-ratio (MTPR), such as from the line driver in FIG. 6.

FIG. 9 illustrates an exemplary simulated multi-tone-power-ratio (MTPR), such as from the line driver in FIG. 6. More specifically, the MTPR illustrated in FIG. 6 may be due to aliasing in a closed-loop 3-level PWM system with $f_{triangle}=8.832$ MHz and signal bandwidth (BW)=2.2 MHz, again assuming the system is ideal. The out-of-band suppression of the LC filter is not included. The plot in FIG. 9 is obtained by taking an average output power spectrum over 40 random DMT symbols (e.g., from the system of FIG. 6), each with PAR=5.6. The input signal may be applied at approximately 90% full-scale. Again a $2^{nd}$-order feedback filter may be a desirable option, both in- and out-of-band.

As illustrated, a signal with $N_{LPF}=1$ (plot 941) produces worse MTPR over much of the frequency range compared with the cases with $N_{LPF}=0$ (plot 940) and $N_{LPF}=2$ (plot 942). Additionally, $N_{LPF}=2$ (plot 942) has better MTPR than $N_{LPF}=0$ (plot 940) and $N_{LPF}=1$ (plot 941) for most of the frequencies.

Figure 10:
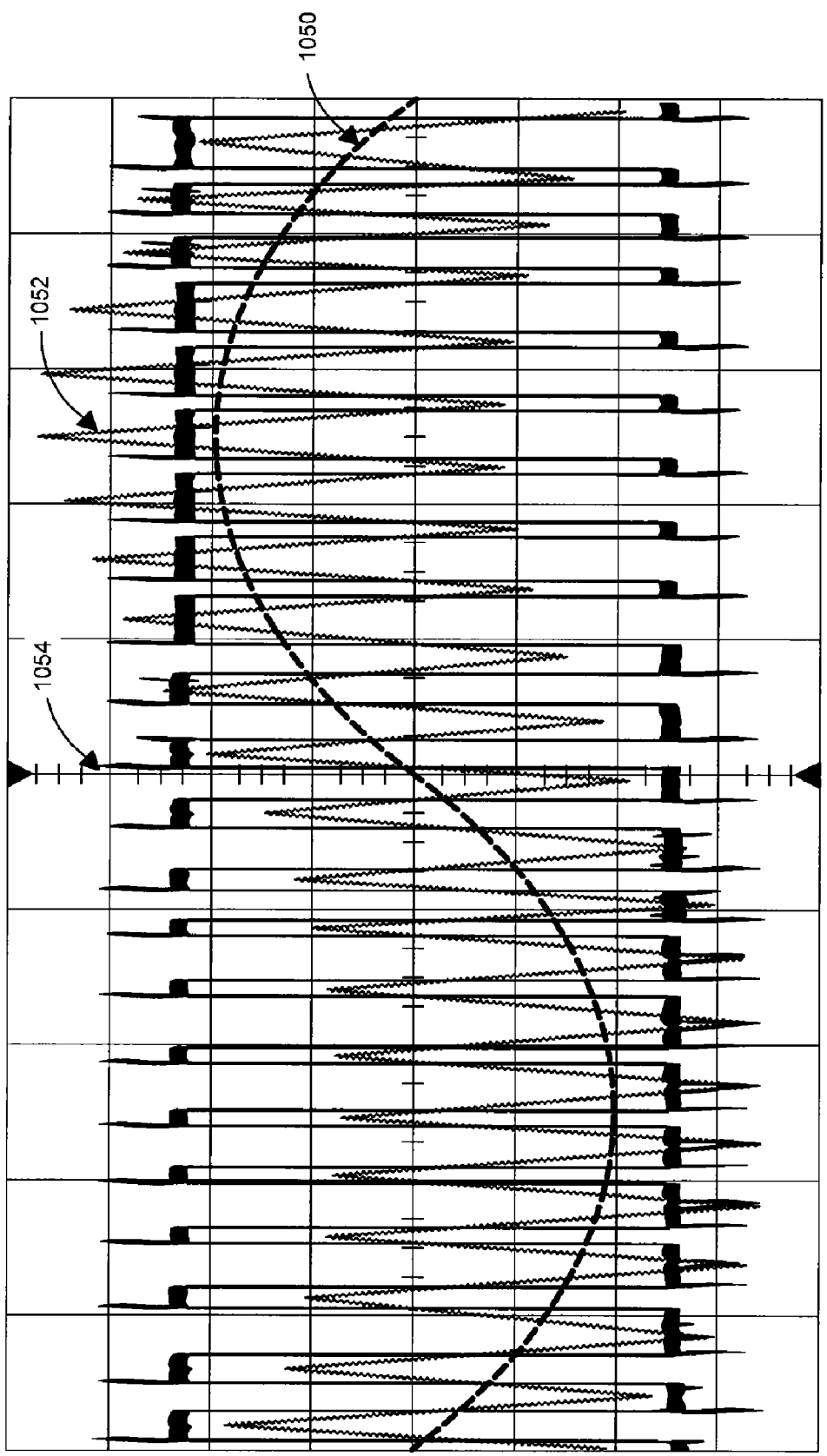
FIG. 10 illustrates exemplary measured waveforms in one half of a bridge, such as from the line driver in FIG. 6.

FIG. 10 illustrates exemplary measured waveforms in one half of a bridge, such as the bridge from FIG. 6. The nonlimiting example of FIG. 10 shows an input sinusoidal signal 1050, a triangle wave subtracted form the sinusoid 1052, and a 2-level PWM signal of one bridge half 1054. Together with the 2-level PWM signal 1054 of the other bridge half this forms the 3-level PWM signal in differential mode. The triangle wave 1052 may be measured through an on-chip test buffer. As also shown, the average level of the subtracted triangular wave 1052 follows the input sinusoid 1050, allowing the comparator to operate as a zero crossing detector. Additionally, the PWM signal 1054 may be configured to switch whenever the triangle subtracted wave 1052 crosses the zero level, confirming the correct functionality of the circuit. Voltage spikes in the PWM signal 1054 caused by bond wire inductance can also be seen. These spikes may cause temporary breakdown of the drain-to-substrate junction of the n-channel device resulting in higher non-linearity and higher power consumption. A Multi-Tone Power Ratio (MTPR) test may be performed to determine the non-linearity of the ADSL2+ line driver (e.g., from the line driver in FIGS. 3, 4, and/or 8). A Discrete Multi Tone (DMT) waveform is a signal including a plurality of discrete frequency components. In the case of an MTPR test, this waveform may include missing frequency components, or spectral notches. The MTPR may include a ratio of the power in a spectral notch to the power in the adjacent individual frequency components.

Figure 11:
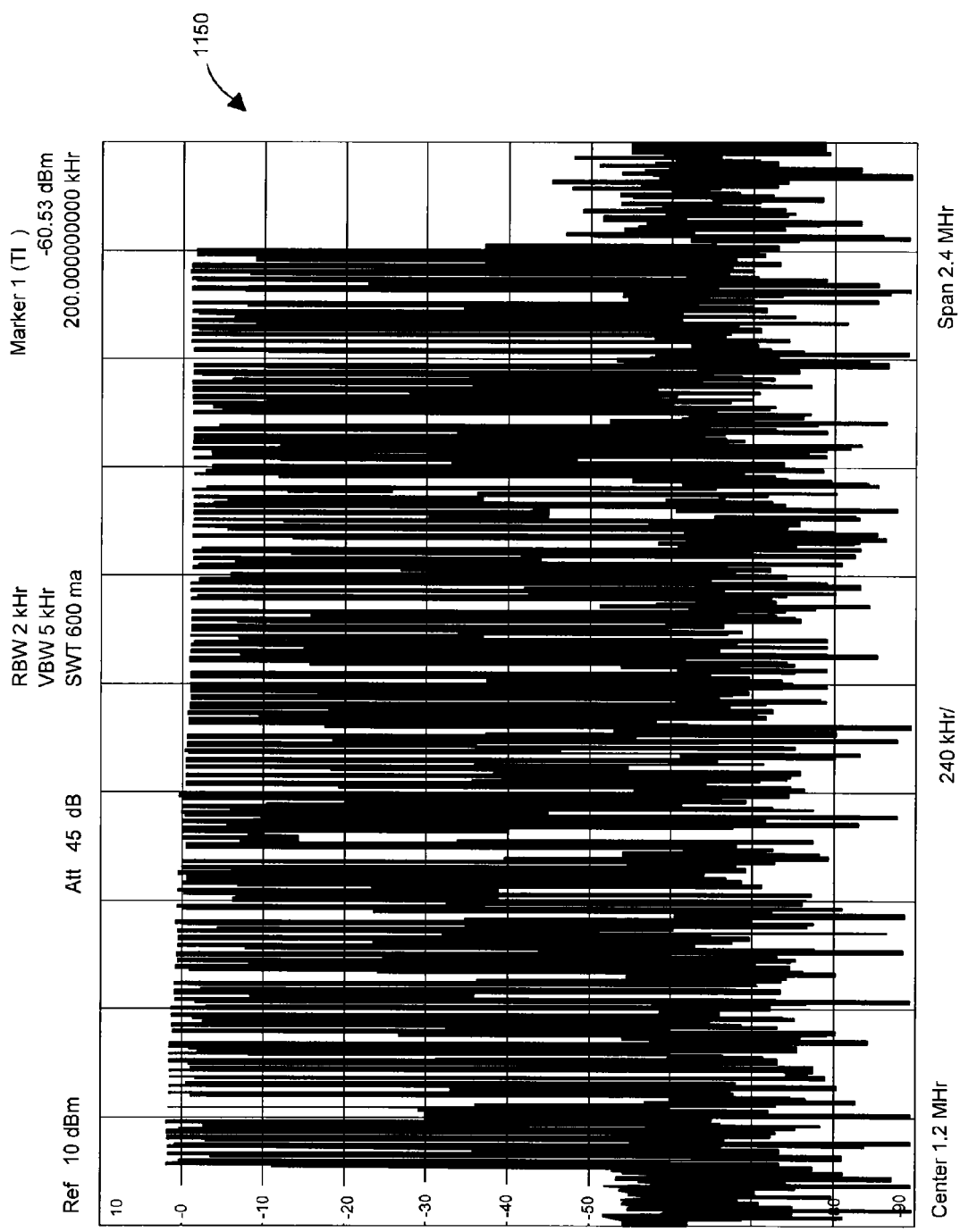
FIG. 11 illustrates an exemplary measured DMT spectrum, such as in the line driver from FIG. 6.

FIG. 11 illustrates an exemplary measured DMT spectrum, such as in the line driver from FIG. 6. As shown, the DMT spectrum 1150 is plotted at the line while delivering 100 mW of power to a 100 Ohm line through a 1:2.3 step-up transformer. In this nonlimiting example, the signal has a peak-to-average ratio (PAR) of approximately 5, giving a peak line voltage of approximately 18V. The resulting worst-case for this exemplary MTPR is approximately −52 dB.

Figure 12:
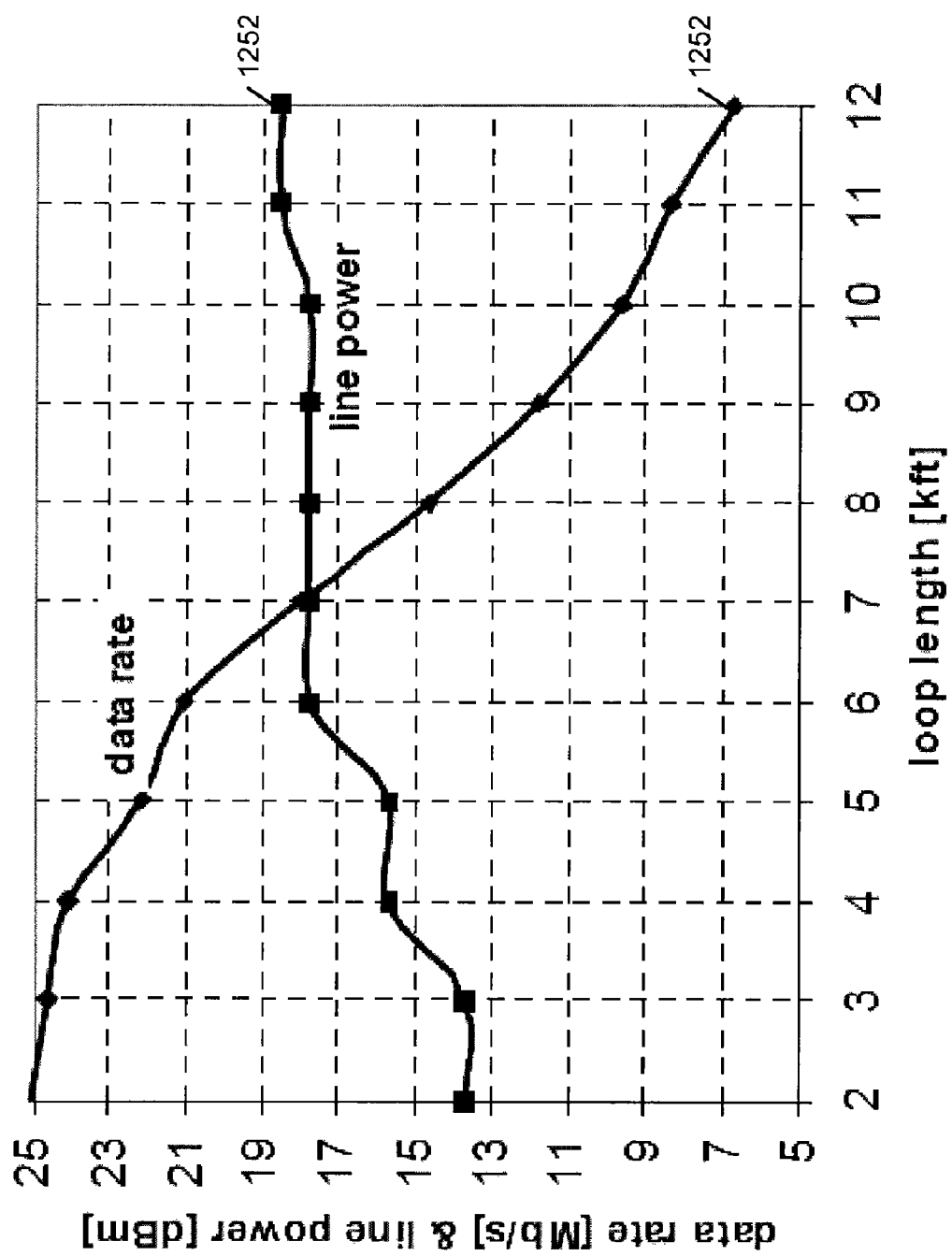
FIG. 12 illustrates a measured ADSL2+ downstream data rate as a function of line length, such as such as may be provided in the line driver from FIG. 6.

FIG. 12 illustrates a measured ADSL2+ downstream data rate as a function of line length, such as may be provided in the line driver from FIG. 6. The measurement may be taken by connecting a central office (CO) board including a class D line driver to a customer premises (CPE) device, through a line simulator box. Generally speaking, in a DSL setup, the line attenuation may increase dramatically as the length increases, especially at higher frequencies, causing the system to reduce the bit loading of the high-frequency DMT tones. Also, the system automatically increases line power 1252 at long loop lengths, to compensate for the increased attenuation and thus loss in SNR. The downstream data rate 1250 may be measured by the CPE itself and obtained through an Ethernet connection to the CPE. Existing firmware may be used in the CO and CPE; by optimizing firmware for this particular line driver the data rate can be increased somewhat more.

One should also note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

It should be emphasized that the above-described embodiments are merely possible examples of implementations, merely set forth for a clear understanding of the principles of this disclosure. Many variations and modifications may be made to the above-described embodiment(s) without departing substantially from the spirit and principles of the disclosure. Further, the scope of the present disclosure is intended to cover all combinations and sub-combinations of all elements, features, and aspects discussed above. All such modifications and variations are intended to be included herein within the scope of this disclosure.

Therefore, at least the following is claimed:

1. A 3-level line driver, comprising:
   a wave generator configured to generate a repetitive wave;
   a first integrator configured to receive an input signal, the first integrator further configured to integrate the input signal;
   a second integrator configured to receive a complement signal of the input signal, the second integrator further configured to integrate the complement to the input signal;
   a first comparator coupled to the first integrator and to the wave generator, the first comparator configured to compare the integrated input signal with the generated wave, the first comparator providing a first naturally sampled PWM signal based on the comparison;
   a second comparator coupled to the second integrator and to the wave generator, the second comparator configured to compare the integrated complement of the input signal with the generated wave, the second comparator providing a second naturally sampled PWM signal based on the comparison;
   a combiner configured to combine the first naturally sampled PWM signal and the second naturally sampled PWM signal to derive a feedback signal to be provided to the first integrator and the second integrator; and
   a filter configured to filter the feedback signal, the filter configured as at least one of the following: a $0^{th}$-order filter and an even order filter.

2. The 3-level line driver of claim 1, wherein the filter includes a low pass filter.

3. The 3-level line driver of claim 1, further comprising a bridge configured to output at least a portion of the received compared signal and compared complement signal as a 3-level signal.

4. The 3-level line driver of claim 1, wherein the wave generator is configured to generate a triangle wave.

5. The 3-level line driver of claim 1, wherein the wave generator is configured to generate a square wave.

6. The 3-level line driver of claim 1, further comprising an inductor-capacitor filter configured to filter high frequency portions of the compared signal and the compared complement signal.

7. The 3-level line driver of claim 1, wherein the first integrator and the second integrator are configured as to have common-mode direct current feedback provided via a forward integrator.

8. A 3-level line driver, comprising:
   means for generating a repetitive wave;
   means for receiving an input signal and a complement of the input signal;
   means for providing a 3-level output signal based on a comparison between the repetitive wave, the input signal and the complement of the input signal, the 3-level output signal including a first naturally sampled PWM signal and a second naturally sampled PWM signal;
   means for combining the first naturally sampled PWM signal and the second naturally sampled PWM signal to derive a feedback signal to be provided to the means for receiving the input signal and the complement of the input signal; and
   means for filtering a the feedback signal, the means for filtering including at least one of the following: a $0^{th}$ order filter and an even order filter.

9. The 3-level line driver of claim 8, further comprising means for integrating with direct current feedback provided via a forward integrator.

10. The 3-level line driver of claim 8, the means for filtering including a low pass filter.

11. The 3-level line driver of claim 8, wherein the means for generating a repetitive signal includes a means for generating a square wave.

12. The 3-level line driver of claim 8, wherein the means for generating a repetitive signal includes a means for generating a triangle wave.

13. The 3-level line driver of claim 8, further comprising means for filtering high frequency portions of the output 3-level signal.

14. The 3-level line driver of claim 8, wherein the 3-level line driver operates with a bandwidth frequency of approximately 2.2 MHz.

15. A method in a 3-level line driver, comprising:
   generating a repetitive wave;
   receiving an input signal at a first integrator and a complement of the input signal at a second integrator;
   providing a 3-level output signal based on a comparison between the repetitive wave, the input signal and the complement of the input signal, the 3-level output signal including a first naturally sampled PWM signal and a second naturally sampled PWM signal;
   combining the first naturally sampled PWM signal and the second naturally sampled PWM signal to derive a feedback signal to be provided to the first integrator and the second integrator; and
   filtering a the feedback signal derived from the first and second naturally sampled PWM signals, the means for filtering including at least one of the following: a $0^{th}$ order filter and an even order filter.

16. The method of claim 15, further comprising integrating the input signal with common-mode direct current feedback provided via a forward integrator.

17. The method of claim 15, wherein the repetitive wave includes a square wave and a triangle wave.

18. The method of claim 15, wherein the repetitive wave includes a square wave and a triangle wave.

19. The method of claim 15, further comprising filtering high frequency portions of at least a portion of the non-overlapping portions of the received compared complement signal.

20. The method of claim 15, wherein the method is performed with a bandwidth frequency of approximately 2.2 MHz.

21. The 3-level line driver of claim 7, wherein the forward integrator comprises a leaky integrator with a finite low-frequency gain.

22. The 3-level line driver of claim 9, wherein the forward integrator comprises a leaky integrator with a finite low-frequency gain.

23. The method of claim 16, wherein the forward integrator comprises a leaky integrator with a finite low-frequency gain.

* * * * *

UNITED STATES PATENT AND TRADEMARK OFFICE
CERTIFICATE OF CORRECTION

PATENT NO. : 8,344,761 B2  
APPLICATION NO. : 12/557584  
DATED : January 1, 2013  
INVENTOR(S) : Lakshmikumar et al.

Page 1 of 1

It is certified that error appears in the above-identified patent and that said Letters Patent is hereby corrected as shown below:

In the Specifications

In Column 6, Line 28, delete "form" and insert -- from --, therefor.

In the Claims

In Column 8, Line 31, in Claim 8, delete "a the" and insert -- the --, therefor.

In Column 8, Line 32, in Claim 8, delete "O$^{th}$" and insert -- 0$^{th}$ --, therefor.

In Column 8, Lines 37-38, in Claim 10, delete "claim 8, the means for filtering including" and insert -- claim 8, wherein the means for filtering includes --, therefor.

In Column 8, Lines 64-65, in Claim 15, delete "a the feedback signal derived from the first and second naturally sampled PWM signals," and insert -- the feedback signal, --, therefor.

Signed and Sealed this  
Twenty-fifth Day of March, 2014

Michelle K. Lee  
*Deputy Director of the United States Patent and Trademark Office*